(12) United States Patent
Jacobson

(10) Patent No.: US 6,499,124 B1
(45) Date of Patent: Dec. 24, 2002

(54) INTEST SECURITY CIRCUIT FOR BOUNDARY-SCAN ARCHITECTURE

(75) Inventor: Neil G. Jacobson, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/306,649

(22) Filed: May 6, 1999

(51) Int. Cl.[7] ............................................. G01R 31/28
(52) U.S. Cl. ...................................... 714/727; 714/726
(58) Field of Search ................................. 714/727, 726; 380/4, 3; 713/200; 365/201; 326/8

(56) References Cited

U.S. PATENT DOCUMENTS

| | | | |
|---|---|---|---|
| 5,130,988 A | * | 7/1992 | Wilcox et al. ............... 714/727 |
| 5,666,411 A | * | 9/1997 | McCarty ......................... 380/4 |
| 5,862,152 A | * | 1/1999 | Handly et al. ............ 371/22.32 |
| 5,898,776 A | * | 4/1999 | Apland et al. .................. 380/3 |
| 5,928,361 A | * | 7/1999 | Nishimura ................... 713/200 |
| 6,061,284 A | * | 5/2000 | Dingemanse et al. ........ 365/201 |
| 6,072,328 A | * | 6/2000 | Takuma .......................... 326/8 |

* cited by examiner

Primary Examiner—David Ton
(74) Attorney, Agent, or Firm—Patrick T. Bever, Esq.

(57) ABSTRACT

A security circuit for an IEEE Standard 1149.1 compliant PLD that is controlled by a security bit or bits programmed when the PLD is incorporated into a final product. The security circuit includes a switch connected directly or indirectly into the Boundary-Scan Register (BSR) chain of the PLD. The security bit applies a control signal to the switch such that test data signals generated during INTEST procedures are either passed through the switch, or blocked by the switch. For example, when the Boundary-Scan architecture of the PLD is set for INTEST procedures when the security bit is set in a first programmed state, the logic gate passes test data from an input terminal to an output terminal. Conversely, when the security bit is set in a second programmed state, the logic gate masks the test data values received at the input terminal (i.e., the shifted test data is blocked).

17 Claims, 11 Drawing Sheets

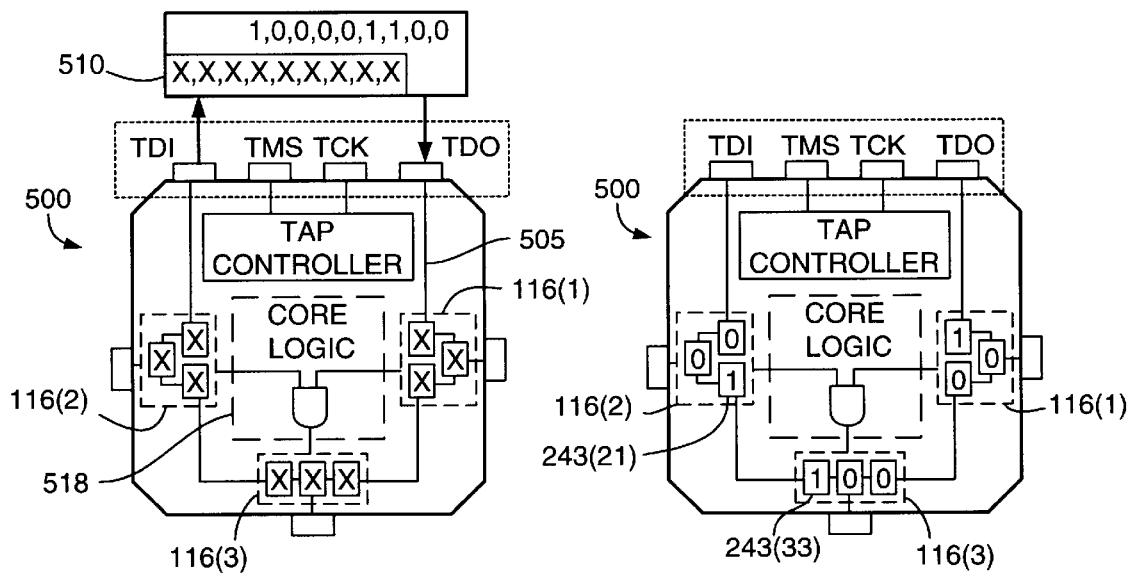
FIG. 5(A)
(PRIOR ART)
FIG. 5(B)
(PRIOR ART)
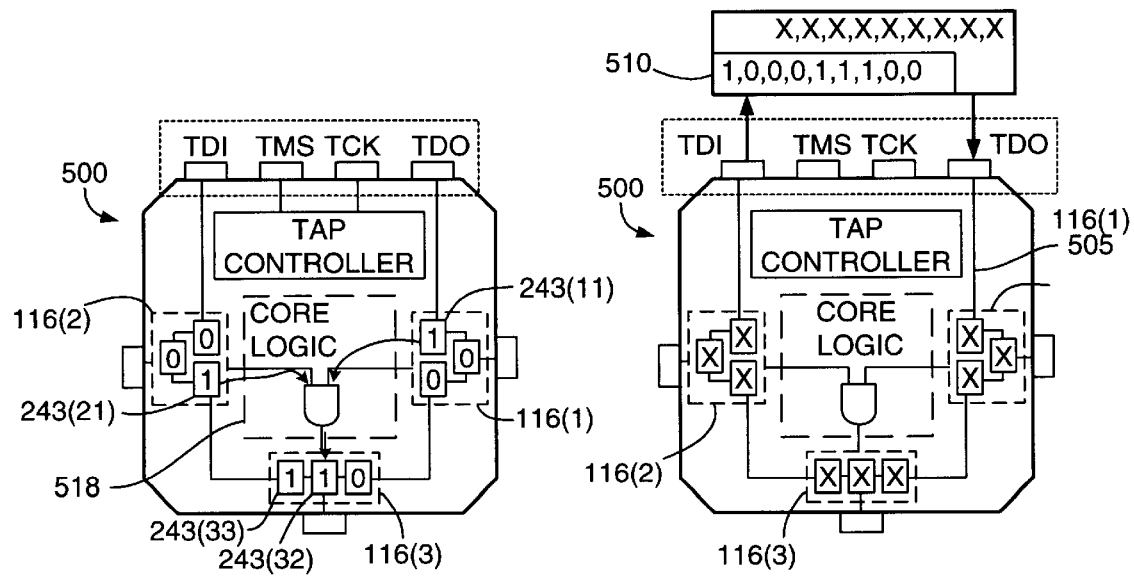
FIG. 5(C)
(PRIOR ART)
FIG. 5(D)
(PRIOR ART)

INTEST SECURITY CIRCUIT FOR BOUNDARY-SCAN ARCHITECTURE

FIELD OF THE INVENTION

The present invention relates to IEEE Standard 1149.1 compliant ICs, and more particularly to IEEE Standard 1149.1 compliant PLDs.

BACKGROUND OF THE INVENTION

Programmable Logic Devices (PLDs) are Integrated Circuits (ICs) that are user configurable and capable of implementing digital logic operations. There are several types of PLDs, including Field Programmable Gate Arrays (FPGAs) and Complex Programmable Logic Devices (CPLDs). CPLDs typically include several function blocks that are based on the well-known programmable logic array (PLA) architecture, and include a central interconnect matrix to transmit signals between the function blocks. Signals are transmitted into and out of the interconnect matrix through input/output blocks (IOBs). The input/output function of the IOBs, the logic performed by the function blocks and the signal paths implemented by the interconnect matrix are all controlled by configuration data stored in configuration memory of the CPLD. FPGAs include configurable logic blocks (CLBs) arranged in rows and columns, IOBs surrounding the CLBs, and programmable interconnect lines that extend between the rows and columns of CLBs. Each CLB includes look-up tables and other configurable circuitry that is programmable to implement a portion of a larger logic function. Similar to CPLDs, the CLBs, IOBs and interconnect lines of FPGAs are controlled by configuration data stored in a configuration memory of the FPGA.

PLDs have become popular for implementing various logic functions in electronic systems that, in the recent past, were typically implemented by smaller (<100,000 gates) application specific integrated circuits (ASICs). Such functions include glue logic, state machines, data bus logic, digital signal processors and protocol functions. Early PLDs often provided insufficient capacity to implement these functions, so the significant investment of time and money to design, layout and fabricate an ASIC for these functions was justified. However, recent advances in semiconductor and PLD technologies have produced PLDs with the necessary speed and capacity to implement these functions in most applications. Because PLDs are relatively inexpensive and can be programmed in as little as a few hours, the expense associated with the design, layout and fabrication of ASICs has become harder to justify. Further, the reprogrammability of many PLDs makes them even more attractive than ASICs because it is possible to update (reconfigure) PLDs, whereas ASICs must be replaced. As such, there is a trend toward the use of PLDs in place of ASICS in electronic systems.

As the capacity and performance of PLDs continues to increase, so too does the complexity of the configuration data used to configure the PLDs. In many instances, the configuration data is developed and modified over a long period of time, and represents a significant investment to the company that develops the configuration data. To protect the proprietary interests of such companies, a security function is provided on most PLDs that prevents a would-be pirate from simply downloading the configuration data from the PLD, thereby preventing the would-be pirate from replicating or reproducing the circuit design implemented on the PLD. This security function is typically implemented as a programmable bit that is set during PLD configuration.

IEEE Standard 1149.1 defines circuitry that allows test instructions and associated test data to be fed into a compliant IC and, subsequently, allows the results of execution of such instructions to be read out of the compliant IC. All information (i.e., instructions, test data, and test results) is communicated in a serial format via a four pin serial interface (referred to as the Test Access Port, or TAP) that drives a 16-state controller (state machine) formed in each compliant IC device. The four pins control transitions of the state machine that facilitates loading of instructions and data into the compliant IC device to accomplish pre-defined tasks. As set forth in greater detail below, one such task is a special instruction named INTEST. The INTEST instruction allows static (slow-speed) testing of the on-chip system logic, with each test pattern and response being shifted through a series of Boundary-Scan registers located, for example, at the I/O pins of IEEE Standard 1149.1 compliant PLDs.

A problem presented by IEEE Standard 1149.1 compliant PLDs is that the INTEST instruction can be used by potential pirates to thwart the security function of a PLD in order to replicate or reproduce the circuit design implemented on the PLD. This problem is set forth is additional detail below by first describing IEEE Standard 1149.1 circuitry found on compliant PLDs, and then illustrating by example how the INTEST instruction can be used to determine the configuration data stored on the PLD.

Originally, IEEE Standard 1149.1 was developed to test the interconnections and IC device placement on PCBs through connection pins of the PCBs (i.e., without the need for a mechanical probe). Since its establishment, IEEE Standard 1149.1 has been extended to include device self-tests, diagnostics, and functional tests such as the INTEST instruction.

FIG. 1 shows a simplified electronic system provided for the purpose of explaining the basic concepts of Boundary-Scan Test procedures. The simplified electronic system is formed on a PCB 100 and includes a first PLD 110 and a second PLD 120.

PCB 100 includes normal operation copper traces formed on a board of insulating material that provide signal paths between a PCB connector 101 and PLDs 110 and 120, and between PLDs 110 and 120. These normal operation copper traces are used, for example, to transmit configuration signals to PLDs 110 and 120, and to carry data signals during device operation. In addition to the normal operation copper traces, PCB 100 includes special purpose copper traces for transmitting signals associated with IEEE Standard 1149.1. These special purpose copper traces include a first trace 102 for transmitting test data-in (TDI) signals, a second trace 103 for transmitting test data-out (TDO) signals, a third trace 104 for transmitting test clock (TCK) signals, and a fourth trace 105 for transmitting test mode select (TMS) signals. Data (TDI/TDO) signals are typically transmitted serially through each compliant device of a system. That is, TDI signals are transmitted on first trace 102 to first PLD 110, and pass through first PLD 110 along a line 144(1). TDO signals are transmitted from PLD 110 and received as TDI signals by second PLD 120 along a linking trace 106, and pass through second PLD 120 along a line 144(2). Finally, TDO signals are transmitted from PLD 120 to PCB connector 101 on second trace 103. In contrast to the data signals, each compliant device receives the TCK and TMS signals in a parallel manner.

Each PLD of an electronic system includes IOBs that configure the device terminals (pins) for transmitting signals to or from the PLDs programmable core logic circuitry. As shown in FIG. 1, first PLD 110 includes I/O terminals 112 that transmit/receive signals via lines 114 through respective IOBs 116 to/from programmable core logic circuit 118. Similarly, second PLD 120 includes I/O terminals 122 that transmit/receive signals via lines 124 through IOBs 126 to/from core logic circuit 128.

Unlike ASICs, the functions performed by both core logic circuit 118 and IOBs 116 of PLD 110 are determined by configuration data loaded after fabrication. That is, function or functions to be performed by the programmable interconnect and logic circuitry associated with a PLD is determined after fabrication. Similarly, the determination of which I/O pins will be used for input operations, and which I/O pins will be used for output operations is made after fabrication. As described in additional detail below, this flexible pin usage requires each IOB 116 to include programmable circuitry capable of performing both input and output operations.

In addition to core logic and input/output circuitry, each IC device that complies with IEEE Standard 1149.1 includes dedicated pins and hardware elements (referred to herein as Boundary-Scan architecture). Referring to FIG. 1, first PLD 110 includes four pins 142(1) through 142(4) that are respectively connected to trace 102 (TDI), trace 105 (TMS), trace 104 (TCK) and trace 106 (TDO). Similarly, second PLD 120 includes four pins 142(5) through 142(8) that are respectively connected to trace 106 (TDI), trace 104 (TCK), trace 105 (TMS) and trace 103 (TDO). The Boundary-Scan architecture of each PLD 110 and 120 includes control circuitry (TEST CONTROL CIRCUIT) and one or more data registers (not shown) that are, for example, incorporated into IOBs 116 and 126. The data and control circuitry of the Boundary-Scan architecture provided on each compliant device utilize the signals received on the four dedicated pins.

FIG. 2 is a detailed block diagram showing an example of the basic hardware elements associated with the Boundary-Scan architecture of an IEEE Standard 1149.1 compliant PLD. The basic hardware elements include a test access port (TAP) 210, a TAP controller 220, an instruction register (IR) 230, an instruction decode circuit 235, a test data register circuit 240, an output multiplexer (MUX) 250, an output flip-flop 260 and a tri-state buffer 270. These hardware elements are well known to those of ordinary skill in the art of designing IEEE Standard 1149.1 compliant ICs. Therefore, only basic hardware elements that are utilized to perform the INTEST instruction will be described herein.

TAP 210 provides access to the test support functions build into an IEEE Standard 1149.1 compliant PLD. TAP 210 includes three input connections for receiving the test clock input (TCK) signal, the test mode select (TMS) signal, and the test data input (TDI) signal. The TCK signal allows the Boundary-Scan architecture to operate synchronously and independently of the built-in system clock provided on the PLD. The TMS signal is used to control the state of TAP controller 220, as discussed below. The TDI signal is used for serial transmission of data or instruction bits, depending upon the state of TAP controller 220. TAP 210 may also include an optional fourth input terminal for receiving a test reset input signal for asynchronous resetting of TAP controller 220. In addition to the above-mentioned input connections, TAP 210 includes an output connection through which the TDO signals are transmitted. Depending upon the state of TAP controller 220, the TDO signal is used to serially shift either instruction register or data register contents out of the PLD.

FIG. 3 is a state diagram for explaining the operation of TAP controller 220 (shown in FIG. 2). The basic function of TAP controller 220 is to generate clock and control signals required for the correct sequence of operations of instruction register 230, test data register circuit 240, output MUX 250, output flip-flop 260 and tri-state buffer 270. Specifically, TAP controller 220 control signals that facilitate loading of instructions into instruction register 230, shifting TDI data into and TDO data out of the data registers in test data register circuit 240, and performing test actions such as capture, shift and update test data. These signals are provided in accordance with the state of TAP controller 220. All state transitions (indicated as arrows in FIG. 3) within TAP controller 220 occur in accordance with the serially received TMS values (shown next to each arrow).

FIG. 4 is a simplified schematic diagram showing an IOB 116 that includes a portion of the Boundary-Scan architecture formed along line 144(1) of first PLD 110 (see FIG. 1). IOB 116 includes an input buffer IB, a tri-state buffer TS and Boundary-Scan Register (BSR) cells 243(1) through 243(3). IOB 116 is configured by an output enable (OE) signal (which is transmitted through BSR cell 243(3)) either to receive input data signals applied to an I/O pin 112, or to transmit output data signals to I/O pin 112. When the OE signal is in a first state (e.g., low), IOB 116 is configured for receiving input signals from I/O pin 112 (i.e., tri-state buffer TS is set in a tri-state mode). In the input mode, input buffer IB transmits DATA IN signals applied to I/O pin 112 through BSR cell 243(1) and on a SYSTEM INPUT line to, for example, the PLD core logic circuit. Conversely, when the OE signal is in a second state (e.g., high), IOB 116 is configured for transmitting output signals to I/O pin 112. In the output mode, output signals transmitted on a SYSTEM OUTPUT line from, for example, the PLD core logic circuit are applied to I/O pin 112 through BSR cell 243(2) and tri-state buffer TS.

BSR cells 243(1) through 243(3) are linked in the manner described below to form a BSR chain along which test data bits are shifted to implement, for example, INTEST procedures. Each BSR cell 243(1) through 243(3) respectively includes an input multiplexer (MUX) 410(1) through 410(3), a shift register flip-flop 420(1) through 420(3), a parallel latch 430(1) through 430(3) and an output MUX 440(1) through 440(3). Each input MUX 410(1) through 410(3) is controlled by a SHIFT/LOAD-DR control signal to either load SYSTEM DATA or shift TDI data from a previous BSR cell of the BSR chain. The selected data is transmitted to shift register flip-flops 420(1) through 420(3) that store the received data in response to a CLOCK DR control signal generated by the TAP controller. Shift register flip-flops 420(1) through 420(3) transmit the stored data either to a next of the BSR cell (or to TDO if transmitted from the last BSR cell) and to parallel latches 430(1) through 430(3), respectively. Parallel latches 430(1) through 430(3) store the data from shift register flip-flops 420(1) through 420(3) in response to an UPDATE-DR control signal from the TAP controller, and transmit this data to output MUXes 440(1) through 440(3), respectively. Output MUXes 440(1) through 440(3) are controlled by a MODE TEST/NORM control signal from the instruction register to either transmit SYSTEM data (during normal operation) or the contents of parallel latches 430(1) through 430(3) (e.g., during INTEST procedures). The signals from output MUXes 440(1) through 440(3) are either transmitted to the core logic (when BSR cell 243 is associated with an input pin) or to the output pin of the PLD.

During INTEST procedures, test data signals are serially transmitted through BSR cells 243(1) through 243(3) in response to the SHIFT-DR and CLOCK-DR signals generated by the TAP controller. Specifically, BSR cell 243(1) receives a TDI signal from a previous BSR cell (not shown) of the BSR on line segment 144(A). This TDI signal is shifted through multiplexer 410(1) and shift register flip-flop 420(1) and transmitted to BSR cell 243(2). Subsequently, BSR cell 243(2) shifts this TDI signal through multiplexer 410(2) and shift register flip-flop 420(2), and transmits it to BSR cell 243(3). Finally, BSR cell 243(3) shifts the TDI signal through multiplexer 410(3) and shift register flip-flop 420(3), and transmits it on line segment 144(B) to a subsequent IOB associated with the BSR.

A problem associated with conventional IEEE Standard 1149.1 compliant PLDs supporting INTEST instructions arises because the Boundary-Scan architecture can be utilized to deduce the functionality of logic resident on the IC by shifting test data values into the BSR cells of IC on the BSR chain, and then analyzing the logic output generated in response to the entered values. By systematically entering all possible combinations of test data values into the BSR cells, the INTEST instruction provides an unintended path for the replication of the IC logic design that works around any device security feature. This problem is illustrated with reference to FIGS. 5(A) through 5(D).

FIGS. 5(A) through 5(D) are simplified schematic diagrams showing a conventional IEEE Standard 1149.1 compliant PLD 500 in which portions of programmable core logic circuit 518 are utilized to implement a two-input AND gate. PLD 500 includes three IOBs 116(1), 116(2) and 116(3), each including three BSR cells that are serially connected to form a BSR chain along line 505. IOBs 116(1), 116(2) and 116(3) are assigned to the input and output signals of the two-input AND gate implemented in core logic circuit 518. In particular, IOBs 116-1 and 116-2 are assigned to transmit input signals from their associated pins to the AND gate, and IOB 116-3 is assigned to transmit the output signal from the AND gate to its associated pin.

Referring to FIG. 5(A), at the beginning of the INTEST procedure, a series of test data values (1,0,0,0,0,1,1,0,0) are shifted into PLD 500 via the TDO terminal and BSR chain 505 from a test data source 510. The data shifting process is implemented by maintaining the TAP controller in SHIFT-DR state 305 (see FIG. 3) for the amount of time required to shift-in the test data values. Note that the test data values previously stored in IOBs 116(1), 116(2) and 116(3) (indicated with X) are simultaneously shifted along BSR chain 505 to test data source 510.

FIG. 5(B) illustrates the location of test data signals in IOBs 116(1), 116(2) and 116(3) after the shifting process is completed. In particular, a logic "1" is stored in BSR cells 243(11), 243(21) and 243(33), and a logic "0" is stored in the remaining BSR cells. At this point of the INTEST procedure, the TAP controller is moved into UPDATE-DR state 309 (see FIG. 3), thereby causing the test data values to be shifted from the shift register flip-flops 420(X) to the parallel latches 430(X) (see FIG. 4).

FIG. 5(C) illustrates the process of applying the test values in accordance with the internal logic of PLD 500. To perform this process, the TAP controller is moved to RUN-TEST/IDLE state 302, at which point the system clock of PLD 500 pulses to cause operation of core logic 518. As indicated by the arrows, the logic "1" values transmitted from BSR cells 243(11) and 243(21) are applied to the logic implemented in core logic 518, which generates an output value (i.e., logic "1" value) that is subsequently captured by BSR cell 243(32) when the TAP controller moved to CAPTURE-DR state 304 (see FIG. 3). Note that this logic "1" value overwrites any previously stored value.

Referring to FIG. 5(D), at the end of the INTEST procedure, a dummy series of test data values (X,X,X,X,X, X,X,X,X) are shifted into PLD 500 via the TDO terminal and BSR chain 505 from a test data source 510. The data shifting process is implemented by returning the TAP controller to SHIFT-DR state 305 (see FIG. 3). Note that the test data values stored in IOBs 116(1), 116(2) and 116(3) are simultaneously shifted along BSR chain 505 to test data source 510.

The test data values generated in FIG. 5(D) are then analyzed to determine the logic performed by PLD 500. By systematically transmitting sets of test data values and comparing the results, the logic implemented in core logic 518 can be replicated, thereby circumventing the IC logic design that works around any security feature provided on PLD 500.

What is needed is a Boundary-Scan architecture that includes a security device for selectively preventing INTEST operations after a IEEE Standard 1149.1 compliant PLD is configured, thereby preventing would-be pirates from replicating configuration data stored on the PLD.

SUMMARY OF THE INVENTION

The present invention is directed to a Boundary-Scan architecture for an IEEE Standard 1149.1 compliant IC that prevents would-be pirates from replicating the logic of the IC using INTEST or other Boundary-Scan instructions by blocking data that is shifted along the Boundary-Scan chain.

In accordance with the present invention, an IEEE Standard 1149.1 compliant IC includes a Boundary-Scan architecture having a security circuit including a switch controlled by a security bit that is selectively enabled or disabled by the IC programmer. In one embodiment, the switch includes a logic gate having a first input terminal and an output terminal connected directly to the Boundary-Scan Register (BSR) chain. The security bit applies a control signal to a second input terminal of the logic gate. When the security bit is in a first programmed state, the logic gate passes test data from the first input terminal to the output terminal that is shifted along the BSR chain to permit normal Boundary-Scan (e.g., INTEST) procedures. Conversely, when the security bit is in a second programmed state, the logic gate generates a predetermined data value onto the BSR chain despite the test data values received at the first input terminal (i.e., the shifted test data is blocked). Blocking the passage of shifted data prevents would-be pirates from using the INTEST operations to replicate the logic of the IC, or the logic function implemented by a PLD.

In another embodiment, the security circuit is located in a signal path connected between the I/O pin and the core logic circuit of a host PLD. During operation, the security circuit is selectively controlled to block test data values from being driven into or captured from the core logic circuit via an associated Boundary-Scan register (BSR cell). When the security bit of the security circuit is disabled, the security circuit passes the test data values being driven into or captured from the core logic circuit. In contrast, when the security bit of the security circuit is enabled, a high INTEST signal causes the security device to generate a low (logic "0") output signal. This low output signal is captured by the associated BSR cell, and the transmitted along the BSR chain during a subsequent data shift operation. Consequently, instead of including test data indicating the configuration of the core logic circuit, the resulting data stream is entirely made up of low (logic "0") output signals. Therefore, it is not possible for a would-be pirate to determine the logic implemented in core logic utilizing the INTEST instruction.

BRIEF DESCRIPTION OF THE DRAWINGS

FIGS. 5(A) through 5(D) are simplified circuit diagrams illustrating an example of a conventional IEEE Standard 1149.1 compliant PLD after configuration.

DETAILED DESCRIPTION OF THE DRAWINGS

The present invention is directed to IEEE Standard 1149.1 compliant ICs, such as Programmable Logic Devices (PLDs), and in particular to security circuits that control the flow of test data signals in the Boundary-Scan architectures of such ICs while maintaining IEEE Standard 1149.1 compliance. Although the security circuits according to the present invention are described below with specific reference to IEEE Standard 1149.1 compliant PLDs, the disclosed security circuitry may be beneficially utilized in other types of IEEE Standard 1149.1 compliant ICs. Therefore, the appended claims should not necessarily be limited to PLDs.

Figure 6A:
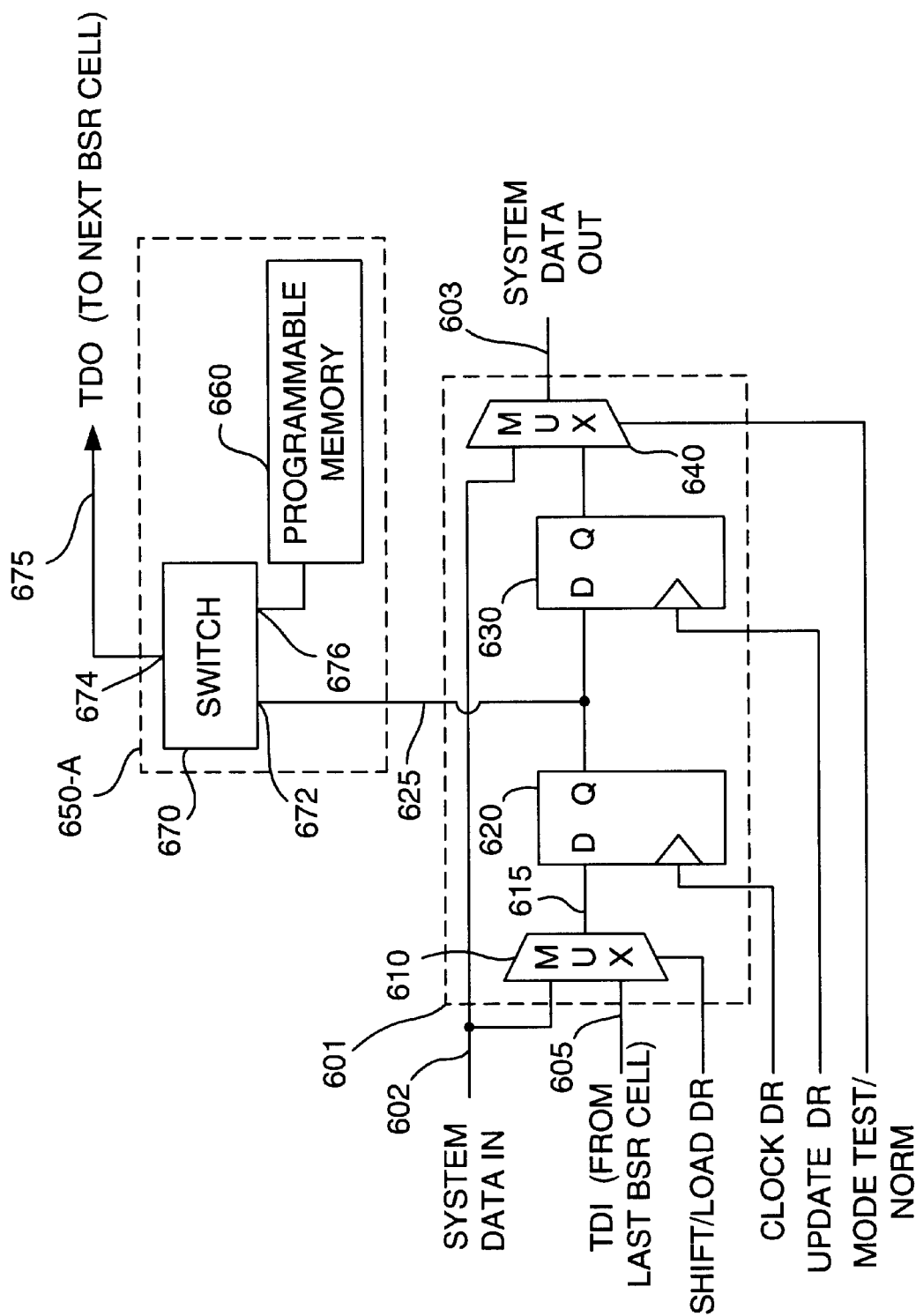
FIGS. 6(A) through 6(C) are block diagrams showing BSR cells in accordance with three embodiments of the present invention.
Figure 6B:
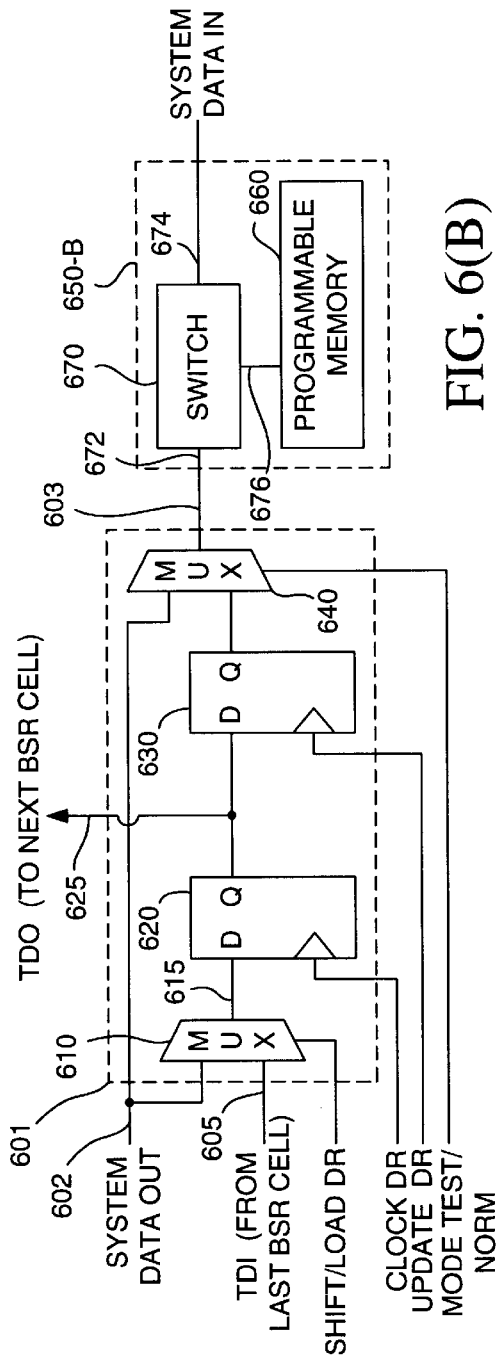
Figure 6C:
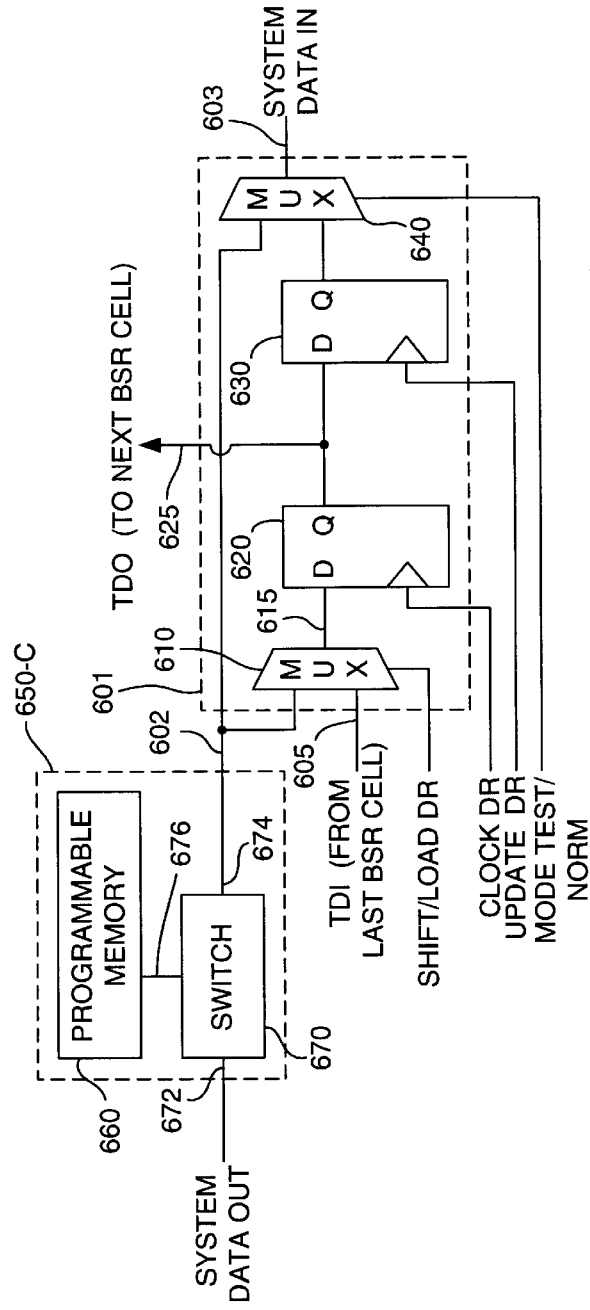

FIGS. 6(A), 6(B) and 6(C) are block diagrams showing portions of IEEE Section 1149.1 compliant PLDs including security circuits 650-A, 650-B and 650-C, respectively, in accordance with three alternative embodiments of the present invention. Each security circuit 650-A, 650-B and 650-C is connected to a BSR cell 601, which includes identical circuitry in each embodiment. Other circuitry of the host PLDs, such as the core logic and TAP controller, is omitted for clarity.

Figure 1:
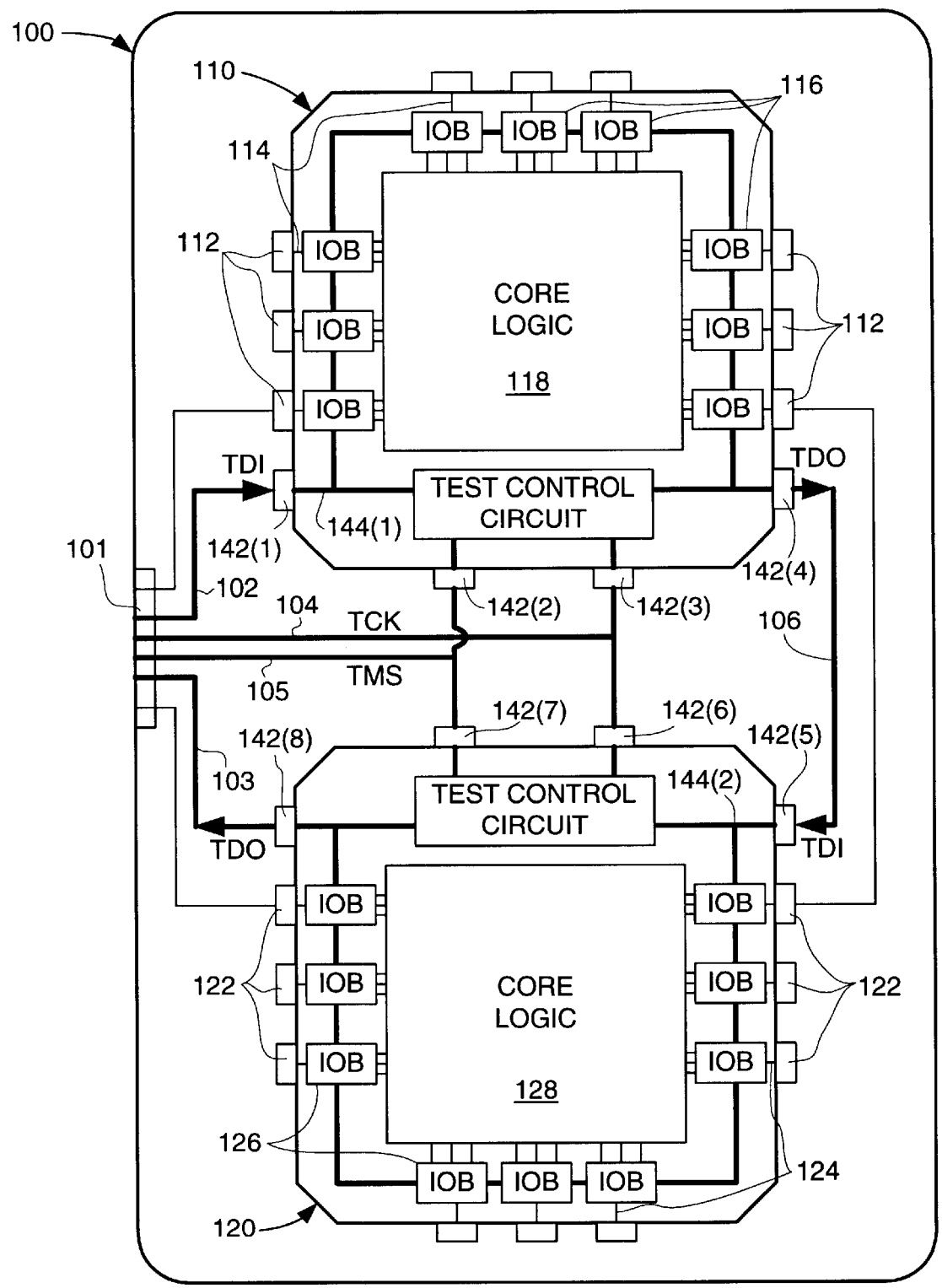
FIG. 1 is a simplified diagram showing an electronic system incorporating IEEE Standard 1149.1 compliant ICs.
Figure 2:
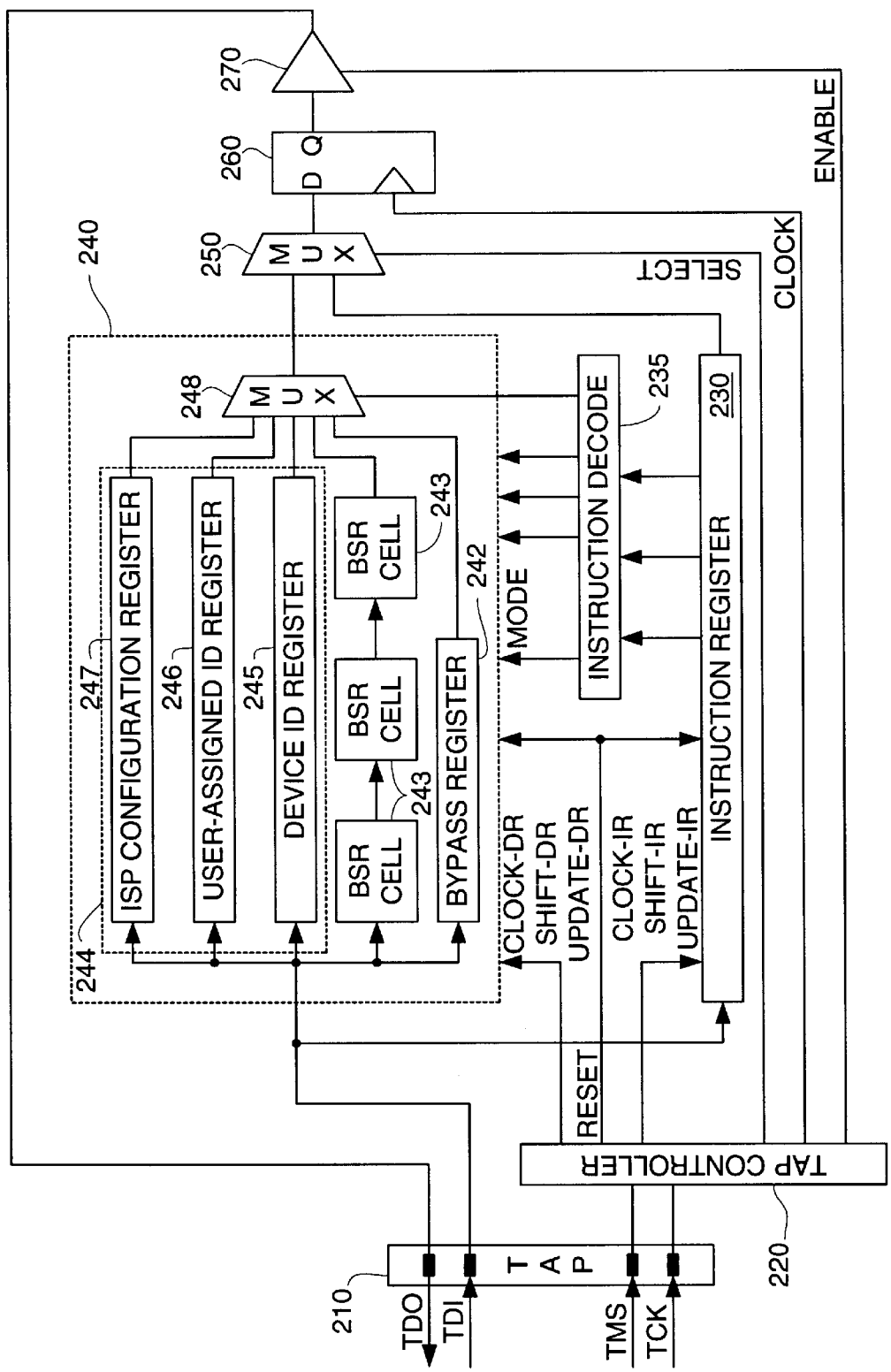
FIG. 2 is a diagram showing an example of a conventional Boundary-Scan architecture found on an IEEE Standard 1149.1 compliant PLD.
Figure 3:
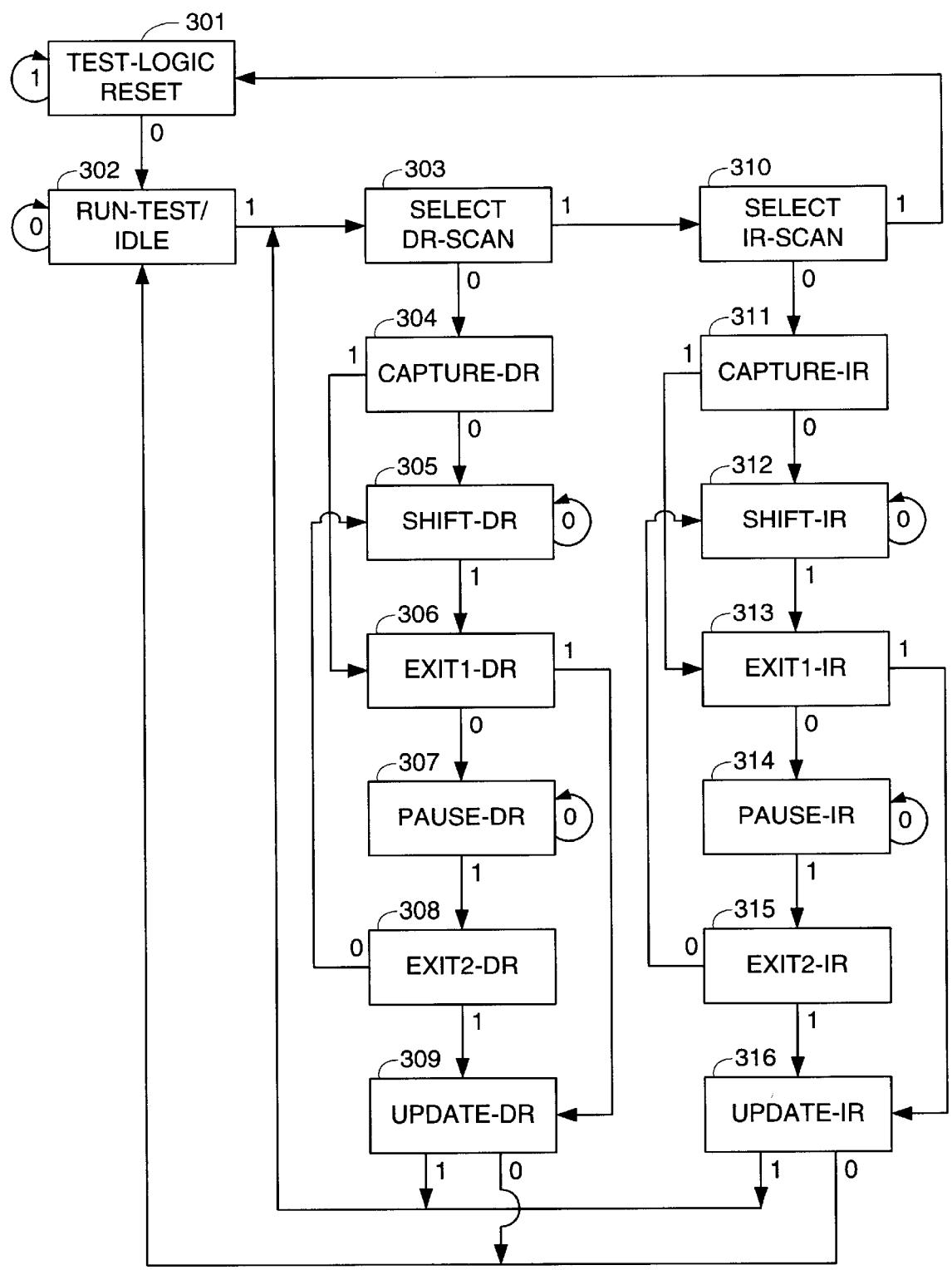
FIG. 3 is a block diagram showing the various states of a state machine associated with the TAP controller of the conventional Boundary-Scan architecture.
Figure 4:
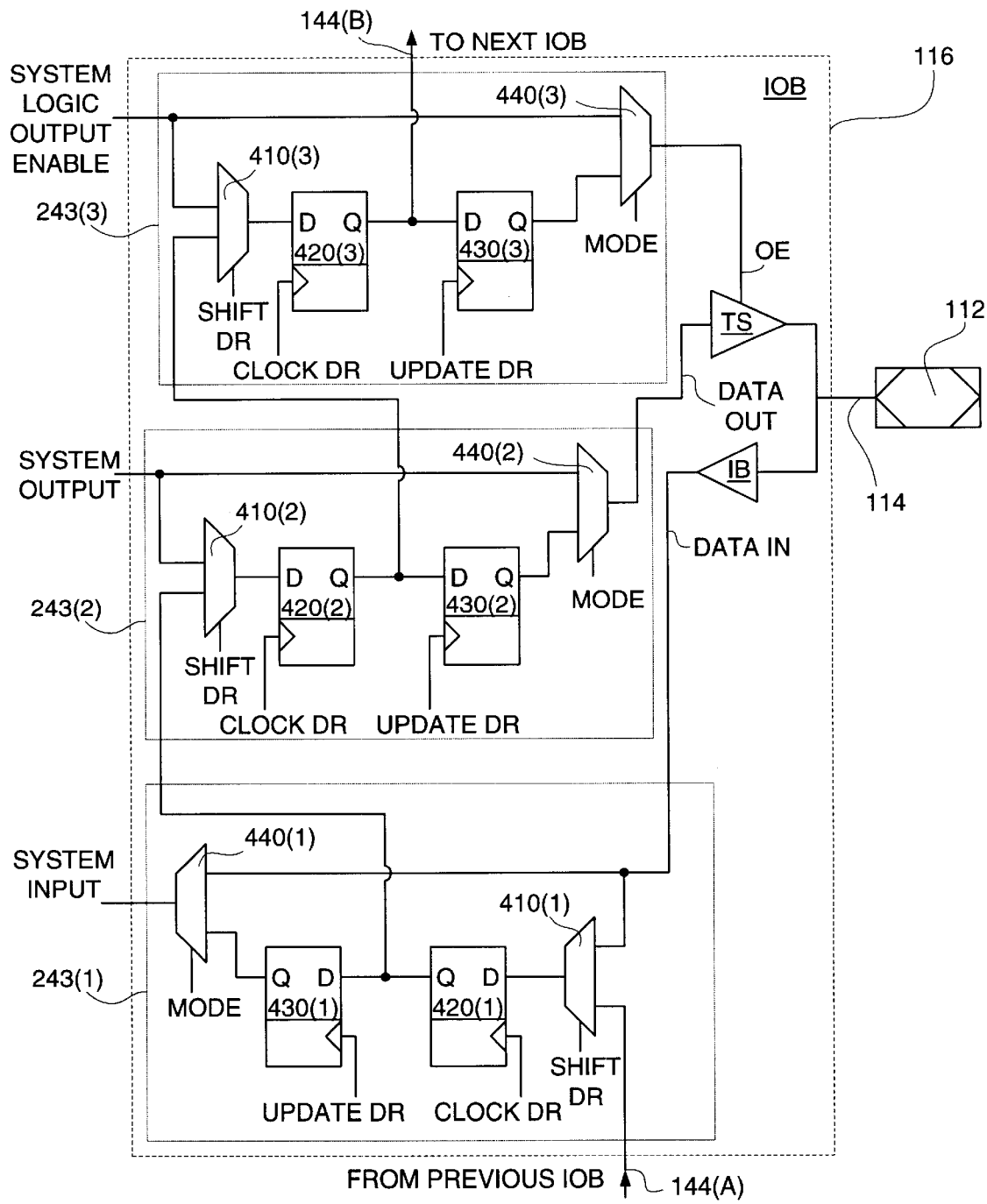
FIG. 4 is a simplified schematic diagram showing a conventional IOB of an IEEE Standard 1149.1 compliant PLD.

BSR cell 601 (shown in each of FIGS. 6(A), 6(B) and 6(C)) is incorporated into the Boundary-Scan architecture of a PLD in a manner similar to that shown in FIG. 2 (i.e., wherein BSR cell 601 replaces conventional BSR cell 243). Similar to conventional BSR cells (e.g., BSR cell 243(1) in FIG. 4), BSR cell 601 includes a test data input (TDI) terminal, a data input terminal 602, an input multiplexer (MUX) 610, a shift register flip-flop 620, a parallel latch 630, an output MUX 640 and a data output terminal 603. BSR cell 601 is connected to the BSR chain of the host PLD that also includes conductive segments 605, 615 and 625 (in addition, in FIG. 6(A), the BSR chain includes conductive segment 675). Input MUX 610 is controlled by a SHIFT/LOAD-DR control signal to either pass signals from data input terminal 602 (e.g., from core logic of the PLD) or signals from the TDI terminal (e.g., from a previous BSR cell via conductive segment 605 of the BSR chain). The selected data is transmitted to shift register flip-flop 620 via conductive segment 615 that stores the received data in response to a CLOCK DR control signal generated by a TAP controller (not shown) of the host PLD. Shift register flip-flop 620 transmits the stored data to parallel latch 630 and conductive segment 625. Parallel latch 630 stores the data from shift register flip-flop 620 in response to an UPDATE-DR control signal from the TAP controller, and transmits this data to output MUX 640. Output MUX 640 is controlled by a MODE TEST/NORM signal, which is generated by the TAP controller, to selectively apply either the data signal transmitted from parallel latch 630 or from data input terminal 602 to output terminal 603 (e.g., to an I/O pin of the PLD).

Each of the security circuits 650-A, 650-B and 650-C (respectively shown in FIGS. 6(A), 6(B) and 6(C)) includes a memory 660 that is programmable to control a switch 670 such that test data signals can be selectively blocked during INTEST or other Boundary-Scan procedures. Specifically, programmable memory 660 is selectively programmable to store a security code (bit). Switch 670 has a first input terminal 672 for receiving a test data signal, and an output terminal 674. Switch 670 also includes a second input (control) terminal 676 connected to receive the security code stored by programmable memory 660. Switch 670 passes a test data signal value from first input terminal 672 to output terminal 674 when programmable memory 660 stores a first security code value (e.g., disable), and blocks the test data signal value transmitted to first input terminal 672 when programmable memory 660 stores a second security code value (e.g., enable). The word "passes" describes the process of generating an output signal at output terminal 674 that is consistent with the test data signal received at first input terminal 672 (i.e., either by passing the test data signal through, for example, a pass transistor, or using, for example, a logic gate to generate an output signal that is consistent with the test data signal). The word "blocks" describes the process of generating an output signal at output terminal 676 that is independent of the test data signal received at first input terminal 672 (e.g., generating a logic "0" on output terminal 676 when the test data signal is either logic "1" or logic "0").

Referring to FIG. 6(A), in accordance with one embodiment, security circuit 650-A is connected in the BSR chain of a host PLD between conductive segments 625 and 675. Specifically, first input terminal 672 of switch 670 is connected to BSR cell 601 via conductive segment 625, and output terminal 674 is connected to the TDO terminal via conductive segment 675. Switch 670 of security circuit 650-A passes a test data signal value transmitted on the BSR chain from BSR cell 601 to output terminal 674 when programmable memory 660 stores a first security code value (e.g., disable). In other words, when programmable memory 660 stores a disable value, the circuit shown in FIG. 6(A) operates in a manner consistent with conventional cells 243(1) through 243(3) (see FIG. 4). Conversely, when programmable memory 660 stores a second security code value (e.g., enable), switch 670 blocks the test data signal value transmitted from the BSR cell 601. Therefore, security circuit 650-A serves to prevent the transmission of test data values along the BSR chain during data shifting operations by generating, for example, logic "0" on conductive segment 675 even if the test data value received from BSR cell 601 is a logic "1".

FIG. 6(B) shows, in accordance with another embodiment, that security circuit 650-B is connected between data output terminal 603 of BSR cell 601 and a SYSTEM DATA IN terminal of a host PLD. The SYSTEM DATA IN terminal is connected, for example, to the core logic of the host PLD. Specifically, first input terminal 672 of switch 670 is connected to BSR cell 601 via data output terminal 603, and output terminal 674 is connected to the SYSTEM DATA IN terminal. Switch 670 of security circuit 650-B passes a data signal value transmitted from parallel latch 630 or data input terminal 602 of BSR cell 601 to output terminal 674 when programmable memory 660 stores a first security code value (e.g., disable). In other words, when programmable memory 660 stores a disable value, the circuit shown in FIG. 6(B) operates in a manner consistent with conventional cell 243(1) (see FIG. 4). Conversely, when programmable memory 660 stores a second security code value (e.g., enable), switch 670 blocks the test data signal value transmitted from the BSR cell 601 to the core logic of the host PLD. Therefore, security circuit 650-B serves to prevent INTEST operations by generating, for example, logic "0" on the SYSTEM DATA IN terminal even if the test data value received from BSR cell 601 is a logic "1".

FIG. 6(C) shows, in accordance with another embodiment, that security circuit 650-C is connected between a SYSTEM DATA OUT terminal of a host PLD and data input terminal 602 of BSR cell 601. The SYSTEM DATA OUT terminal is connected, for example, to the core logic of the host PLD. Specifically, first input terminal 672 of switch 670 is connected to the SYSTEM DATA OUT terminal, and output terminal 676 is connected to BSR cell 601 via data input terminal 602. Switch 670 of security circuit 650-C passes a data signal value transmitted from the SYSTEM DATA OUT terminal to input terminal 672 when programmable memory 660 stores a first security code value (e.g., disable). In other words, when programmable memory 660 stores a disable value, the circuit shown in FIG. 6(C) operates in a manner consistent with conventional cells 243(2) and 243(3) (see FIG. 4). Conversely, when programmable memory 660 stores a second security code value (e.g., enable), switch 670 blocks the test data signal value transmitted from the core logic of the host PLD from BSR cell 601. Therefore, security circuit 650-B serves to prevent INTEST operations by generating, for example, logic "0" that is transmitted to the BSR chain even if the test data value received from the core logic is a logic "1".

Figure 7:
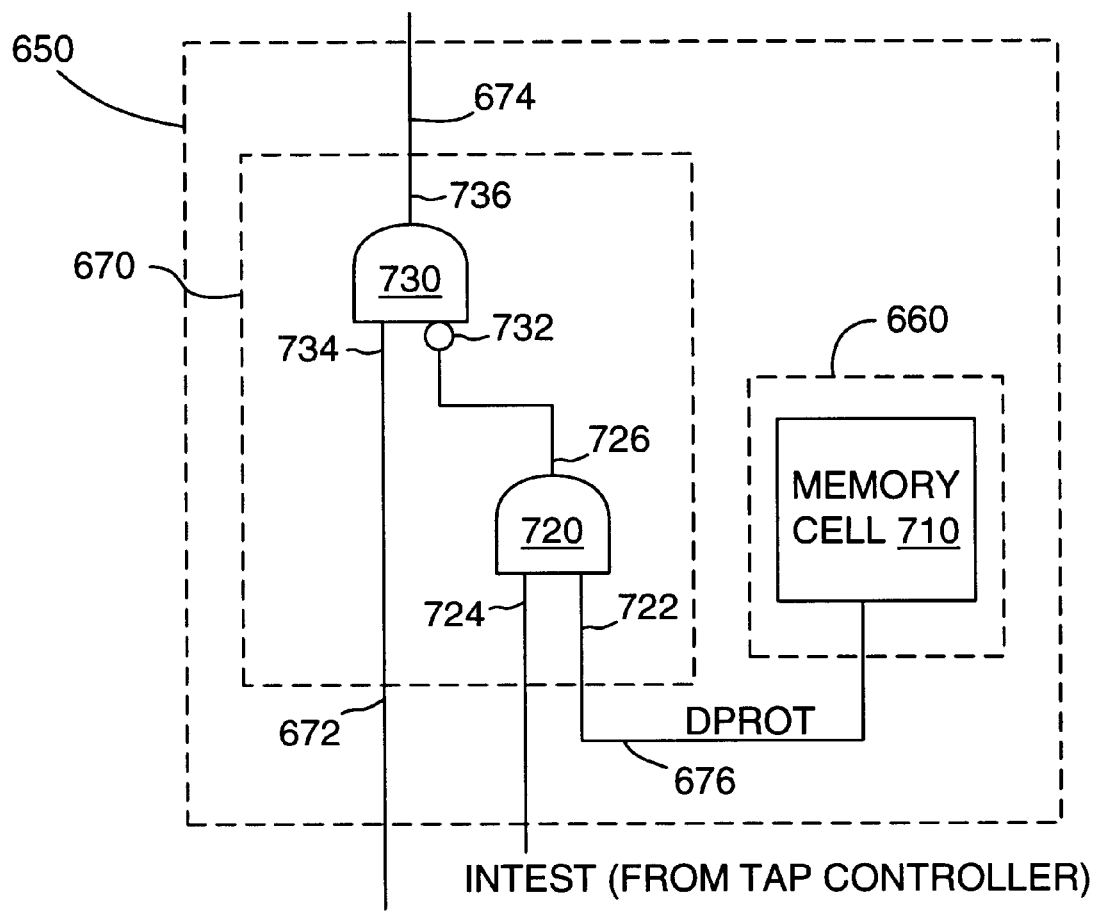
FIG. 7 is a simplified circuit diagram showing a security circuit associated with the BSR cells shown in FIGS. 6(A) through 6(C).

FIG. 7 is a simplified circuit diagram showing security circuit 650 according to an embodiment of the present invention.

Programmable memory 660 includes one or more memory cells 710 that are selectively programmable to store a security code value. Memory cell 710 may be implemented by any type of non-volatile memory cells (such as EPROM, EEPROM, fuse or antifuse memory cells). Methods for programming such memory cells, as well as methods for securing the programmed memory cells from undesired tampering, are well known in the art. The security code value stored by programmable memory 660 is applied as a security signal DPROT to input terminal 676 of switch 670.

In accordance with the disclosed embodiment, switch 670 includes a first AND gate 720 and a second AND gate 730. First AND gate 720 includes a first input terminal 722 connected to receive the DPROT security signal from input terminal 676, a second input terminal 724 connected to receive the INTEST control signal generated by the TAP controller (not shown) of the PLD, and an output terminal 726 for transmitting an output signal that is a logic AND of the INTEST and DPROT signals. Second AND gate 730 includes an inverted (indicated by bubble) input terminal 732 connected to output terminal 726 of first AND gate 720, a second input terminal 734 connected to receive a test data signal, and an output terminal 736 for generating an output signal. In accordance with the disclosed embodiment, when the DPROT signal is disabled (low), first AND gate 720 generates, despite the logic level of the INTEST signal, a low output signal that is applied to inverted input terminal 732 of second AND gate 730. In response to the low signal at inverted input terminal 732, second AND gate 736 passes (i.e., reproduces) the test data signal received at first input terminal 672 to output terminal 674. In contrast, when the INTEST signal is asserted and the DPROT signal is enabled (high), first AND gate 720 generates a high output signal that is applied to inverted input terminal 732 of second AND gate 730. In response to the high signal at inverted input terminal 732, second AND gate 736 blocks the test data signal received at first input terminal 672, and generates a constantly low output signal at output terminal 674. Because the output signal is constantly low during the INTEST operation, a would-be pirate is thwarted from replicating the logic stored in the PLD.

Figure 8:
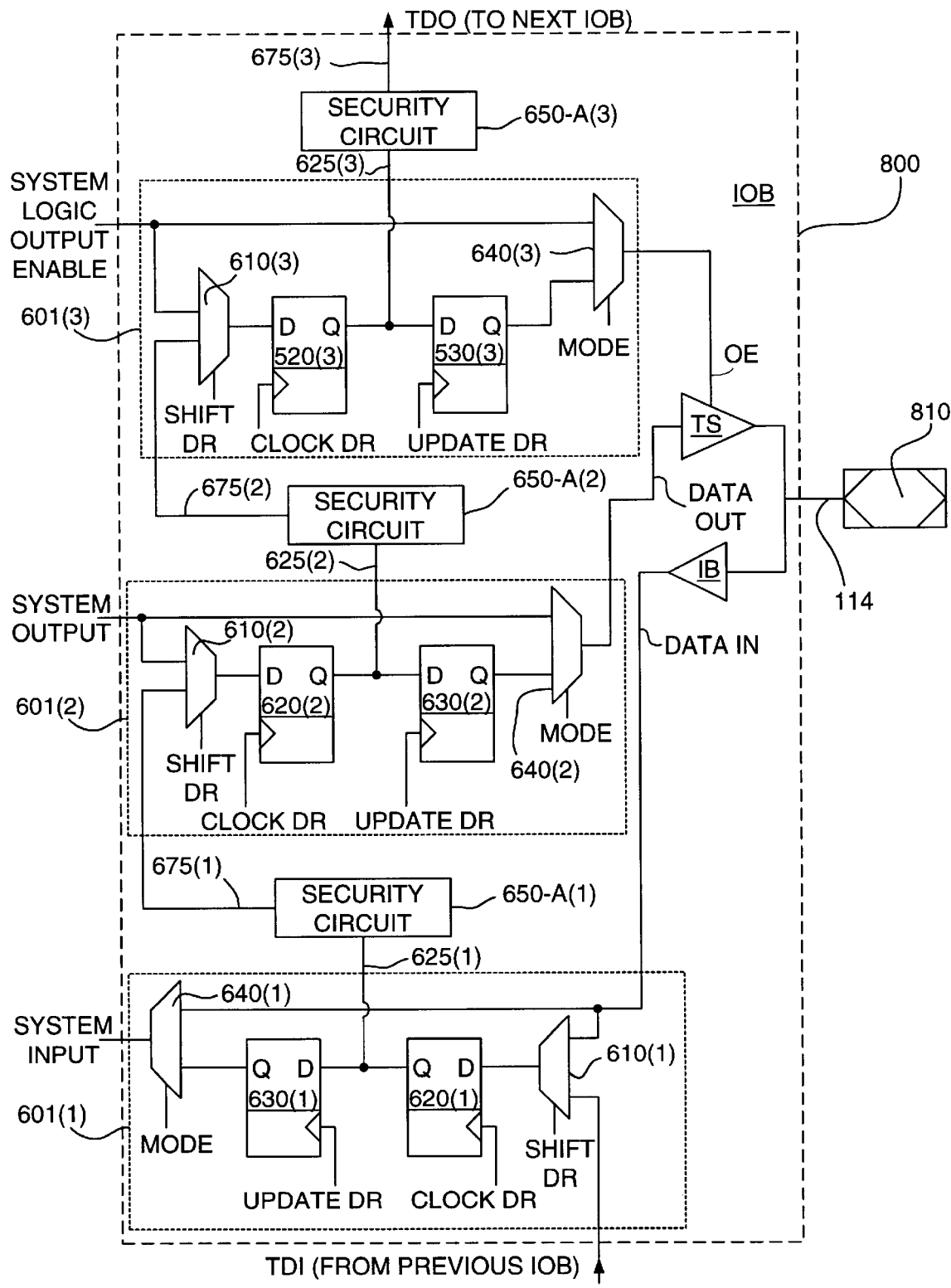
FIG. 8 is a block diagram showing an IOB in accordance with a another embodiment of the present invention.

FIG. 8 is a block diagram showing an IOB 800 in accordance with another embodiment of the present invention. IOB 800 is typically formed on a host PLD (not shown) and controls an I/O pin 810 of the host PLD. IOB 800 includes three BSR cells 601(1), 601(2) and 601(3) that are connected to a core logic circuit (not shown) of the host PLD, and are linked by conductive segments that form a portion of a BSR chain of the host PLD. In addition, IOB 800 includes three security circuits 650-A(1), 650-A(2) and 650-A(3) that are connected to the BSR chain. Each of the BSR cells 601(1), 601(2) and 601(3) and security circuits 650-A(1), 650-A(2) and 650-A(3) includes the components discussed above with reference to FIG. 6(A).

IOB 800 is arranged such that one security circuit is located on the BSR chain between adjacent pairs of BSR cells. BSR cell 601(1) receives TDI signals from a previous IOB (not shown) connected to the BSR chain and a DATA IN signal from input buffer IB, and outputs a SYSTEM INPUT signal that is transmitted to, for example, the core logic circuit of the host PLD. In addition, test data signals stored in shift register flip-flop 620(1) of BSR cell 601(1) are applied to a first conductive segment 625(1) of the BSR chain. Security circuit 650-A(1) is connected between first conductive segment 625(1) and a second conductive segment 675(1), which is connected to an input terminal of an input MUX 610(2) of BSR cell 601(2). BSR cell 601(2) receives data signals from BSR cell 601(1) via second conductive segment 675(1), and from a SYSTEM OUTPUT terminal that is connected to the core logic circuit. BSR cell 601(2) generates a DATA OUT signal that is transmitted to tri-state buffer TS. In addition, test data signals stored in shift register flip-flop 620(2) of BSR cell 601(2) are applied to a third conductive segment 625(2) of the BSR chain. Security circuit 650-A(2) is connected between third conductive segment 625(2) and a fourth conductive segment 675(2), which is connected to an input terminal of an input MUX 610(3) of BSR cell 601(3). BSR cell 601(3) receives data signals from BSR cell 601(2) via fourth conductive segment 675(2), and from a SYSTEM LOGIC OUTPUT ENABLE terminal connected to the core logic circuit, and generates an output enable (OE) signal that is transmitted to tri-state buffer TS. Tri-state buffer TS is controlled in response to the OE signal to transmit the DATA OUT signals to I/O pin 810.

Similar to conventional IOB 116 (discussed above), IOB 800 is configured during normal operation by output enable (OE) signal (which is transmitted through BSR cell 601(3)) either to receive input data signals applied to I/O pin 810, or to transmit output data signals to I/O pin 810. When the OE signal is in a first state (e.g., low), IOB 800 is configured for receiving input signals from I/O pin 810 (i.e., tri-state buffer TS is set in a tri-state mode). In the input mode, input buffer IB transmits DATA IN signals applied to I/O pin 810 through BSR cell 601(1) and on a SYSTEM INPUT line to, for example, the core logic circuit of the host PLD. Conversely, when the OE signal is in a second state (e.g., high), IOB 800 is configured for transmitting output signals to I/O pin 810. In the output mode, output signals transmitted on a SYSTEM OUTPUT line from, for example, the core logic circuit, are applied to I/O pin 810 through BSR cell 601(2) and tri-state buffer TS.

Figures 9, 10:
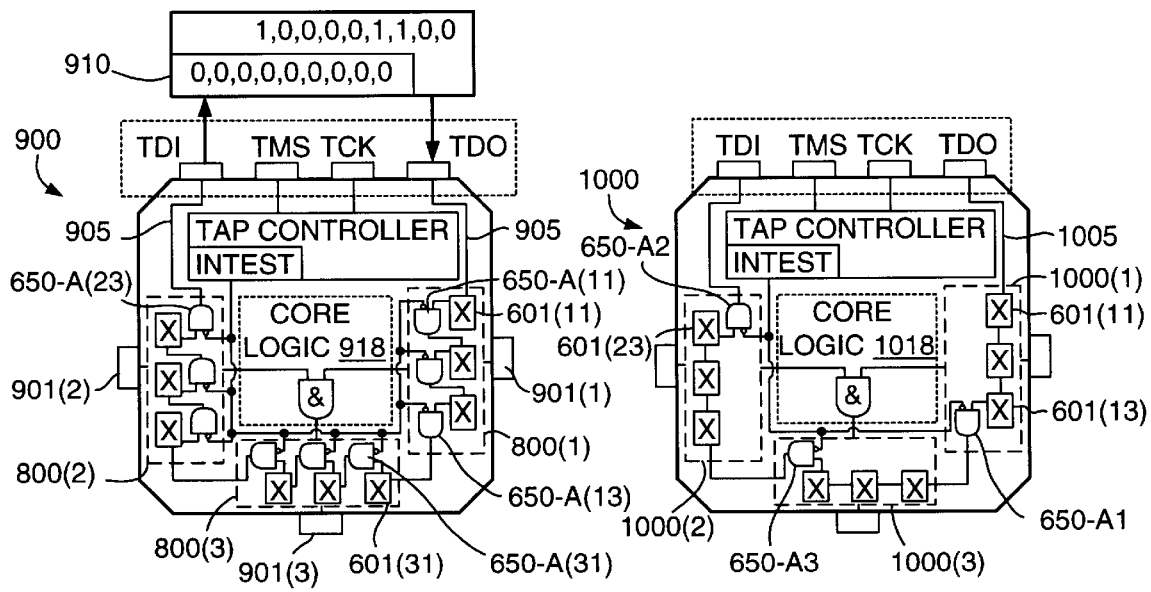
FIG. 9 is a block diagram showing a programmable logic device in accordance with another embodiment of the present invention.
FIG. 10 is a block diagram showing a programmable logic device in accordance with another embodiment of the present invention.

FIG. 9 is a simplified diagrams showing a PLD 900 incorporating a BSR chain 905 that extends between a TDI terminal and a TDO terminal of PLD 900. PLD 900 is, for example, an FPGA or a CPLD that includes a plurality of IOBs 800(1), 800(2) and 800(3) for transmitting signals between a programmable core logic circuit 918 and a plurality of I/O pins 901(1) through 901(3), respectively. Each of the IOBs 800(1) through 800(3) includes the I/O circuitry discussed above with respect to FIG. 8. In particular, each IOB includes three BSR cells 601(X1), 601(X2) and 601(X3) ("X" being the IOB number), each BSR cell including the components discussed above with reference to FIG. 6(A). In addition, each IOB includes three security circuits 650-A(X1), 650A-(X2) and 650-A(X3) ("X" being the IOB number), each security circuit including the components discussed above with reference to FIGS. 6(A) and 7 (a simplified notation is used to identify the security circuits in the figure).

PLD 900 operates as follows. When the security bit of each security circuit 650-A(XX) is disabled, each security circuit passes the test data value received from an associated BSR cell (i.e., PLD 900 operates essentially identically to conventional PLD 500, described above). In contrast, when the security bit of each security circuit is enabled, the high INTEST signal causes each security device to generate a low (logic "0") output signal, even if the security device receives a high (logic "1") input signal. Therefore, any sequence of test data values shifted into BSR chain 905 via the TDO terminal is blocked by the security circuits associated with each IOB. Further, any test results generated by core logic circuit 918 are blocked during subsequent shift operations. An example of a resulting data stream is illustrated in test data source 910. The sample input test data pattern 1,0,0,0, 0,1,1,0,0 is selected randomly. For any such input test data pattern, the output signals generated at the TDI terminal are all logic "0". Consequently, it is not possible for a would-be pirate to determine the logic implemented in core logic circuit 918 utilizing the INTEST instruction.

Although the present invention has been described in considerable detail with reference to certain preferred embodiments thereof, one of ordinary skill would recognize that several variations to the disclosed embodiments are possible. Several examples of such variations are described in the following paragraphs with reference to FIGS. 10 to 13.

FIG. 10 is a simplified diagram showing a PLD 1000 incorporating a BSR chain 1005 that extends between a TDI terminal and a TDO terminal. PLD 1000 includes IOBs 1000(1), 1000(2) and 1000(3) for transmitting signals between a programmable core logic circuit 1018 and a plurality of I/O pins. In accordance with the present embodiment, each of the IOBs 1000(1) through 1000(3) includes the three BSR cells 601(X1), 601(X2) and 601(X3) ("X" being the IOB number), each BSR cell including the components discussed above with reference to FIG. 6(A). In addition, IOBs 1000(1), 1000(2) and 1000(3) include security circuits 650-A1, 650-A2 and 650-A3, respectively, each security circuit including the components discussed above with reference to FIGS. 6(A) and 7. IOBs 1000(1) through 1000(3) differ from IOBs 800(1) through 800(3) of FIG. 9 in that the number of security circuits provided in each IOB is reduced from three to one. Similar to the example shown in FIG. 9, when the security bit of each security circuit is enabled, the high INTEST signal causes each security device to generate a low (logic "0") output signal, even if the security device receives a high (logic "1") input signal. Therefore, any sequence of test data values shifted into BSR chain 1005 via the TDO terminal is blocked by the security circuits associated with each IOB. The fewer number of security circuits renders PLD 1000 easier to fabricate, but may reduce the level of security achieved by the PLD.

Figures 11, 12:
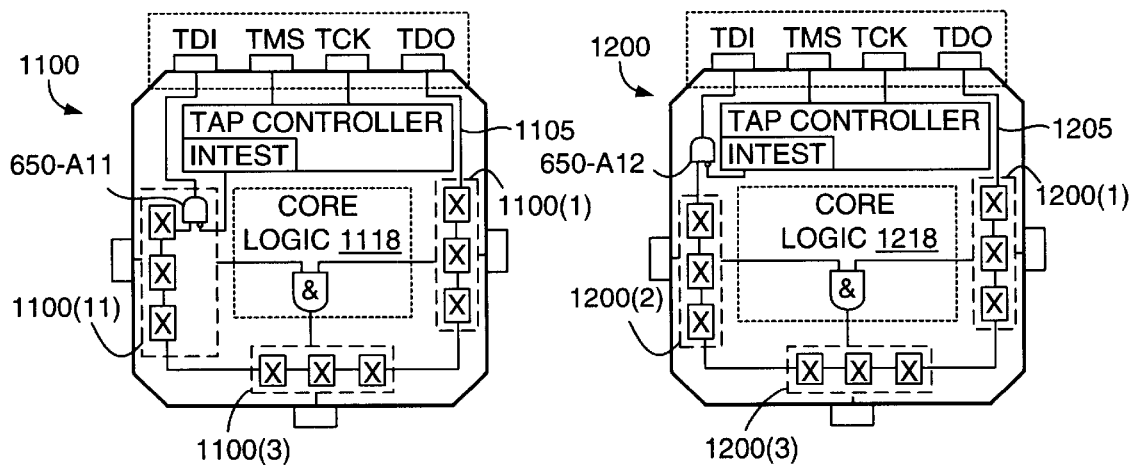
FIG. 11 is a block diagram showing a programmable logic device in accordance with another embodiment of the present invention.
FIG. 12 is a block diagram showing a programmable logic device in accordance with another embodiment of the present invention.

FIG. 11 is a simplified diagram showing a PLD 1100 incorporating a BSR chain 1105 that extends between a TDI terminal and a TDO terminal. PLD 1100 includes IOBs 1100(1), 1100(2) and 1100(3) for transmitting signals between a programmable core logic circuit 1118 and a plurality of I/O pins. In accordance with the present embodiment, IOBs 1100(1) and 1100(3) are essentially identical to the IOBs of conventional PLD 500 (discussed above). Only IOB 1100(2) includes a security device 650-A11 that includes the components discussed above with reference to FIGS. 6(A) and 7. Similar to PLD 1000, PLD 1100 is easier to fabricate than PLD 900 (both described above), but may further reduce the level of security as discussed above with PLD 1000.

FIG. 12 is a simplified diagram showing another PLD 1200 in which IOBs 1200(1), 1200(2) and 1200(3) are essentially identical to the IOBs of conventional PLD 500 (discussed above). A separate security circuit 650-A12 is provided on BSR chain 1205 after the IOB 1200(2) that includes the components discussed above with reference to FIGS. 6(A) and 7. Similar to PLDs 1000 and 1100, PLD 1200 is even easier to fabricate than PLD 900 (both described above), but may reduce the level of security as discussed above with PLDs 1000 and 1100.

Figure 13:
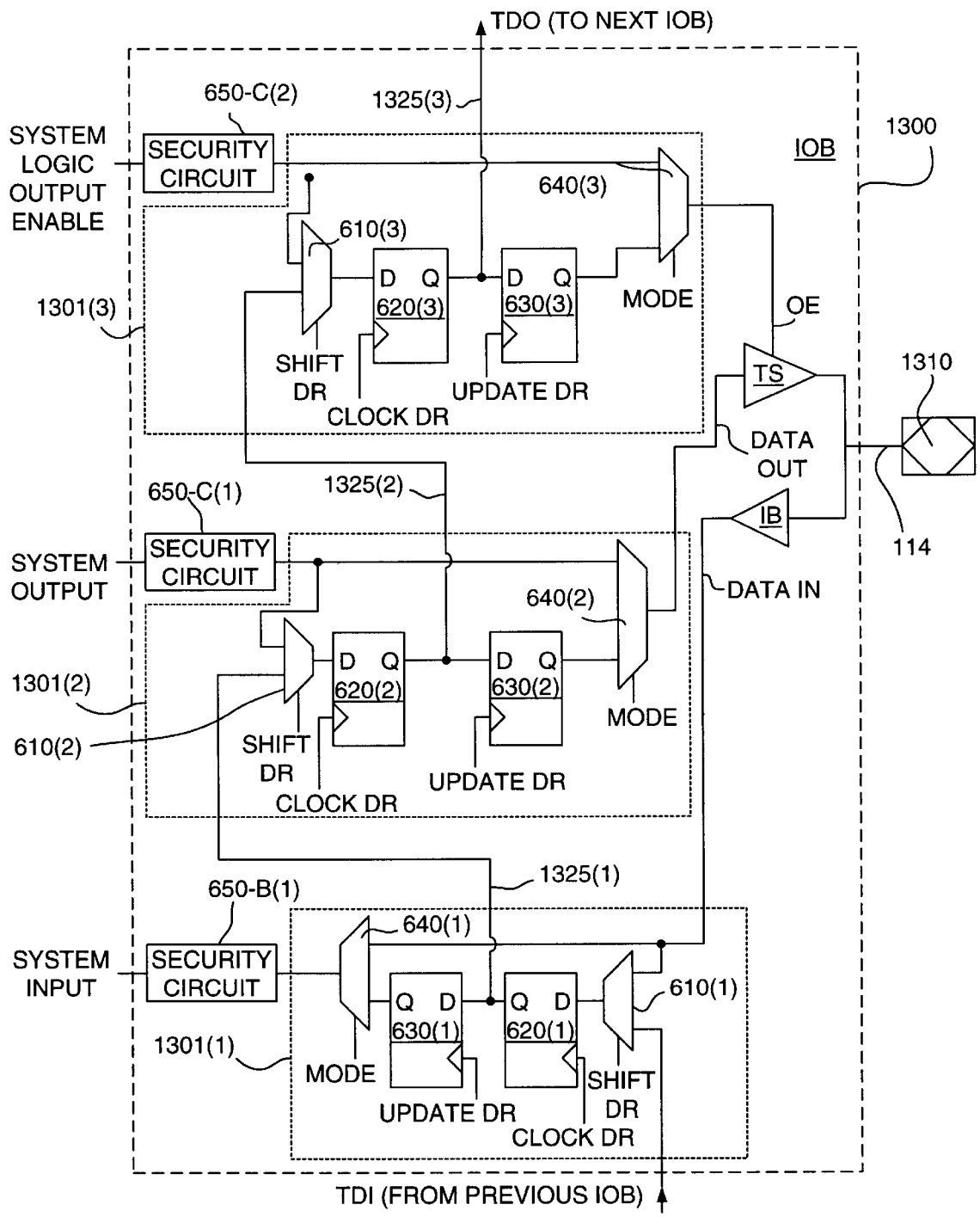
FIG. 13 is a block diagram showing an IOB in accordance with another embodiment of the present invention.

FIG. 13 is a block diagram showing an IOB 1300 in accordance with another embodiment of the present invention. IOB 1300 is typically formed on a host PLD (not shown) and controls an I/O pin 1310 of the host PLD. IOB 1300 includes three serially-connected BSR cells 1301(1), 1301(2) and 1301(3) that form a portion of a BSR chain of the host PLD, each BSR cell including the components that operate in the manner discussed above with reference to FIGS. 6(B) and 6(C) (like components are identified with the same reference numerals). In addition IOB 1300 includes a first security circuit 650-B(1) that is connected to BSR cell 1301(1) in the manner shown in FIG. 6(B), and security circuits 650-C(1) and 650-C(2) that are connected to BSR cells 1301(2) and 1301(3), respectively, in the manner shown in FIG. 6(C). Security circuits 650-B(1), 650-C(1) and 650-C(2) are located in the signal paths connected between I/O pin 1310 and the core logic circuit (not shown) of the host PLD. Specifically, BSR cell 1301(1) receives TDI signals from a previous IOB (not shown) of the BSR chain and a DATA IN signal from input buffer IB, and outputs a SYSTEM INPUT signal that is transmitted to, for example, the core logic circuit of the host PLD through first security circuit 650-B(1). First security circuit 650-B(1) operates in the manner described above with reference to FIG. 6(B). BSR cell 1301(2) receives data signals from BSR cell 1301(1) via conductive segment 1325(1) and a SYSTEM OUTPUT signal from the core logic circuit via second security circuit 650-C(1), and generates a DATA OUT signal that is transmitted to tri-state buffer TS. Finally, BSR cell 1301(3) receives data signals from BSR cell 1301(2) and a SYSTEM LOGIC OUTPUT ENABLE signal from the core logic circuit via a third security circuit 650-C(2), and generates an output enable (OE) signal that is transmitted to tri-state buffer TS. Second security circuit 650-C(1) and third security circuit 650-C(2) operate in the manner described above with reference to FIG. 6(C). Tri-state buffer TS is controlled in response to the OE signal to transmit the DATA OUT signals to I/O pin 1310.

During operation of IOB 1300, security circuits 650B(1), 650-C(1) and 650-C(2) are selectively controlled to block the transmission of test data values from being driven into or captured from the core logic circuit. When the security bit of each security circuit is disabled, each security circuit passes the test data values being driven into or captured from the core logic circuit (i.e., PLD 1300 operates essentially identically to conventional PLD 500, described above). In contrast, when the security bit of each security circuit is enabled, the high INTEST signal causes each security device to generate a low (logic "0") output signal. These low output signals are driven into the core logic circuit of the host PLD from security circuit 650-B(1), thereby interfering with test operations of the host PLD. Conversely, low output signals generated by security circuits 650-C(1) and 650-C(2) are selectively captured by BSR cells 1301(2) and 1301(3), and then transmitted on conductive segments 1325(2) and 1325(3) of the BSR chain during a subsequent data shift operation. Consequently, instead of including test data indicating the configuration of the core logic circuit, the resulting data stream is entirely made up of low (logic "0") output signals. Therefore, it is not possible for a would-be pirate to determine the logic implemented in the core logic circuit utilizing the INTEST instruction.

While the embodiments described above are directed to methods for preventing would-be pirates from using the INTEST instruction to replicate the logic of IEEE Standard 1149.1 compliant ICs and PLDs, other applications of the security circuit are possible. In another embodiment the security circuit shown in FIG. 7 blocks all data shifting operations (i.e., with or without using the INTEST instruction). In yet another embodiment, the security circuit is responsive to any other IEEE Standard 1149.1 instruction (public or private) that could be used to infer the logic functionality of IEEE Standard 1149.1 compliant ICs and PLDs. For example, the security circuits described above may be modified to perform security operations during RUNBIST instructions. In yet another embodiment, logic gate 720 (FIG. 7) is replaced by a NAND gate, and inverted input terminal 732 is replaced by a non-inverted terminal.

Because of the many possible variations of the present invention, as illustrated in the above examples, the spirit and scope of the appended claims should not be limited to the description of the preferred embodiments contained herein.

I claim:

1. An IEEE Standard 1149.1 compliant integrated circuit comprising:

a Boundary-Scan architecture including a test data input terminal and a test data output terminal, a Boundary-Scan chain including conductive segments linked between the test data input terminal and the test data output terminal, a controller, and a first Boundary-Scan Register (BSR) cell connected between first and second conductive segments of the Boundary-Scan chain, the first BSR cell being controlled to transmit test data signals from the first conductive segment to the second conductive segment in response to control signals received from the controller; and a security circuit comprising:

a programmable memory that is selectively programmable to store either a first security data code or a second security data code; and a switch having a first input terminal, a second input terminal, a third input terminal, and an output terminal, the first input terminal being connected to the first BSR cell, the second input terminal being connected to the programmable memory, and the third input terminal being connected to receive a first control signal from the controller of the Boundary-Scan architecture, wherein the switch is controlled by the programmable memory and the first control signal such that the switch passes a test data signal from the input terminal to the output terminal when the programmable memory stores the first security data code, and blocks the test data signal only when the programmable memory stores the second security data code and the first control signal has a predetermined logic level.

2. The integrated circuit according to claim 1, wherein the switch of the security circuit comprises:

a first logic gate having a first input terminal connected to the programmable memory, a second input terminal connected to receive the first control signal from the controller, and an output terminal; and a second logic gate having a first input terminal connected to the output terminal of the first logic gate, a second input terminal connected to the first input terminal of the switch, and an output terminal connected to the output terminal of the switch;

wherein the first logic gate generates a second control signal in response to the programmable memory and the first control signal, and wherein the second logic gate blocks the test data signal only when the programmable memory stores the second security data code and the first control signal has a predetermined logic level.

3. The integrated circuit according to claim 1, further comprising an input/output block (IOB) including the first BSR cell and a second BSR cell connected to the Boundary-Scan chain such that the switch is connected between the first BSR cell and the second BSR cell.

4. The integrated circuit according to claim 1, wherein the first BSR cell comprises:

a cell input terminal;

a multiplexer (MUX) having a first input terminal connected to the Boundary-Scan chain and a second input terminal connected to the cell input terminal, a shift register flip-flop having an input terminal connected to an output terminal of the input MUX;

a parallel latch having an input terminal connected to an output terminal of the shift register flip-flop;

an output MUX having a first input terminal connected to the cell input terminal and a second input terminal connected to an output terminal of the parallel latch; and a cell output terminal connected to an output terminal of the output MUX;

wherein the second conductive segment is connected to the output terminal of the shift register flip-flop, and wherein the first input terminal of the security circuit is connected to the second conductive segment.

5. The integrated circuit according to claim 4, further comprising a core logic circuit connected to the cell input terminal of the BSR cell.

6. The integrated circuit according to claim 1, wherein the first BSR cell comprises:

an cell input terminal;

a multiplexer (MUX) having a first input terminal connected to the Boundary-Scan chain and a second input terminal connected to the cell input terminal, a shift register flip-flop having an input terminal connected to an output terminal of the input MUX;

a parallel latch having an input terminal connected to an output terminal of the shift register flip-flop;

an output MUX having a first input terminal connected to the cell input terminal and a second input terminal connected to an output terminal of the parallel latch; and a cell output terminal connected to an output terminal of the output MUX;

wherein the first input terminal of the security circuit is connected to the cell output terminal.

7. The integrated circuit according to claim 6, further comprising a core logic circuit connected to the output terminal of the security circuit.

8. The integrated circuit according to claim 1, wherein the programmable memory of the security circuit comprises a non-volatile memory cell.

9. An IEEE Standard 1149.1 compliant integrated circuit comprising:

a Boundary-Scan architecture including a test data input terminal and a test data output terminal, a Boundary-Scan chain including conductive segments linked between the test data input terminal and the test data output terminal, a controller, and a Boundary-Scan Register (BSR) cell connected between two conductive segments of the Boundary-Scan chain; and a security circuit comprising:

a programmable memory that is selectively programmable to store either a first security data code or a second security data code; and a switch having a first input terminal, a second input terminal, a third input terminal, and output terminal, the second input terminal being connected to the programmable memory, and the output terminal being connected to the BSR cell, and the third input terminal being connected to receive a first control signal from the controller of the Boundary-Scan architecture, wherein the switch is controlled by the programmable memory and the first control signal such that the switch passes a test data signal from the input terminal to the output terminal when the programmable memory stores the first security data code, and blocks the test data signal only when the programmable memory stores the second security data code and the first control signal has a predetermined logic level.

10. The integrated circuit according to claim 9, wherein the switch of the security circuit comprises:

a first logic gate having a first input terminal connected to the programmable memory, a second input terminal connected to receive the first control signal from the controller, and an output terminal; and a second logic gate having a first input terminal connected to the output terminal of the first logic gate, a second input terminal connected to the first input terminal of the switch, and an output terminal connected to the output terminal of the switch;

wherein the first logic gate generates a second control signal in response to the programmable memory and the control signal, and wherein the second logic gate blocks the test data signal only when the programmable memory stores the second security data code and the first control signal has a predetermined logic level.

11. The integrated circuit according to claim 9, wherein the first BSR cell comprises:

a cell input terminal;

a multiplexer (MUX) having a first input terminal connected to the Boundary-Scan chain and a second input terminal connected to the cell input terminal, a shift register flip-flop having an input terminal connected to an output terminal of the input MUX;

a parallel latch having an input terminal connected to an output terminal of the shift register flip-flop;

an output MUX having a first input terminal connected to the cell input terminal and a second input terminal connected to an output terminal of the parallel latch; and a cell output terminal connected to an output terminal of the output MUX;

wherein the output terminal of the security circuit is connected to the cell input terminal of the BSR cell.

12. The integrated circuit according to claim 11, further comprising a core logic circuit connected to the input terminal of the security circuit.

13. The integrated circuit according to claim 9, wherein the programmable memory of the security circuit comprises a non-volatile memory cell.

14. An IEEE Standard 1149.1 compliant integrated circuit comprising:

a Boundary-Scan architecture including a test data input terminal and a test data output terminal, a Boundary-Scan chain including conductive segments linked between the test data input terminal and the test data output terminal, means for generating a first control signal, and a Boundary-Scan Register (BSR) cell connected between two conductive segments of the Boundary-Scan chain; and a security circuit connected to the BSR cell, the security circuit comprising:

storage means for selectively storing either a first security data code or a second security data code; and switch means for passing a test data signal when the storage means stores the first security data code, and for blocking the test data signal only when the storage means stores the second security data code and the controller generates the first control signal.

15. The integrated circuit according to claim 14, wherein the switch means includes an input terminal connected the BSR cell.

16. The integrated circuit according to claim 14, wherein the switch means includes an output terminal connected to the BSR cell.

17. The integrated circuit according to claim 14, wherein the switch means includes:

a first logic gate having a first input terminal connected to the storage means, a second input terminal connected to receive the first control signal from the controller, and an output terminal; and a second logic gate having an input terminal connected to the output terminal of the first logic gate; and wherein the second logic gate blocks the test data signal only when the storage means stores the second security data code and the first control signal has a predetermined logic level.

* * * * *